United States Patent
Cheon et al.

(10) Patent No.: US 10,545,185 B2
(45) Date of Patent: Jan. 28, 2020

(54) APPARATUS AND METHOD FOR DIAGNOSING CURRENT SENSOR

(71) Applicant: LG Chem, Ltd., Seoul (KR)

(72) Inventors: Bo-Mu Cheon, Daejeon (KR); Myeong-Hui Park, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 16/193,635

(22) Filed: Nov. 16, 2018

(65) Prior Publication Data

US 2019/0195942 A1 Jun. 27, 2019

(30) Foreign Application Priority Data

Dec. 21, 2017 (KR) .......................... 10-2017-0177341

(51) Int. Cl.
| | |
|---|---|
| *G01R 31/28* | (2006.01) |
| *G01R 19/165* | (2006.01) |
| *G01R 31/02* | (2006.01) |
| *H01M 10/42* | (2006.01) |
| *G01R 35/00* | (2006.01) |
| *G01R 19/00* | (2006.01) |

(Continued)

(52) U.S. Cl.
CPC ..... *G01R 31/2829* (2013.01); *G01R 19/0092* (2013.01); *G01R 19/16528* (2013.01); *G01R 31/025* (2013.01); *G01R 31/026* (2013.01); *G01R 35/00* (2013.01); *H01M 10/425* (2013.01); *G01R 31/3842* (2019.01); *G01R 31/396* (2019.01); *H01M 2010/4271* (2013.01)

(58) Field of Classification Search
None
See application file for complete search history.

(56) References Cited

U.S. PATENT DOCUMENTS

| | | | |
|---|---|---|---|
| 8,185,332 B2* | 5/2012 | Kang | G01R 31/389 702/65 |
| 9,935,492 B2* | 4/2018 | Smith | H02J 7/0065 |
| 10,018,683 B2* | 7/2018 | Yoon | G01R 31/36 |

(Continued)

FOREIGN PATENT DOCUMENTS

| | | | | |
|---|---|---|---|---|
| JP | 11-252809 A | 9/1999 | | |
| JP | 2008135310 A | * | 6/2008 | ............. B60K 6/365 |

(Continued)

*Primary Examiner* — Jermele M Hollington
(74) *Attorney, Agent, or Firm* — Lerner, David, Littenberg, Krumholz & Mentlik, LLP

(57) ABSTRACT

Apparatus and method for diagnosing a current sensor serially connected to a battery module having at least one secondary battery, including a measuring unit connected to both ends of at least one secondary battery and both ends of the battery module to measure voltages, and connected to both ends of the current sensor to measure current flowing through, and a control unit including a first deviation checking part checking a first voltage deviation between the voltage at both ends of each secondary battery at first and second times by setting a time difference, a second deviation checking part summing the voltages at both ends of each secondary battery and checking a second voltage deviation between the summed voltage and the voltage at both ends of the battery module, and a diagnosing part diagnosing whether the current sensor is in an open circuit state using the first and second voltage deviations.

9 Claims, 5 Drawing Sheets

(51) Int. Cl.
  *G01R 31/3842* (2019.01)
  *G01R 31/396* (2019.01)

(56) References Cited

U.S. PATENT DOCUMENTS

| | | |
|---|---|---|
| 2011/0285538 A1 | 11/2011 | Lee et al. |
| 2014/0217987 A1* | 8/2014 | Shim ................. G01R 31/3842 320/134 |
| 2016/0020629 A1* | 1/2016 | Lee ..................... H01M 10/482 320/164 |
| 2016/0126573 A1 | 5/2016 | Yoon et al. |
| 2017/0115370 A1 | 4/2017 | Chang et al. |
| 2017/0199250 A1* | 7/2017 | Yoon ....................... G01R 31/36 |
| 2019/0079136 A1* | 3/2019 | Lim ........................ G01R 31/36 |
| 2019/0094328 A1* | 3/2019 | Iwata ................... G01R 35/007 |

FOREIGN PATENT DOCUMENTS

| | | | | |
|---|---|---|---|---|
| JP | 2009254165 A | * | 10/2009 | ................ H02J 7/00 |
| JP | 6279413 B2 | | 2/2018 | |
| KR | 2011-0100863 A | | 9/2011 | |
| KR | 101326508 B1 | | 11/2013 | |
| KR | 2013-0137389 A | | 12/2013 | |
| KR | 101610534 B1 | | 4/2016 | |
| KR | 20160080207 A | * | 7/2016 | ............. G01R 35/00 |
| KR | 2016-0111166 A | | 9/2016 | |
| KR | 101714243 B1 | * | 3/2017 | ............. B60L 58/12 |
| KR | 101714243 B1 | | 3/2017 | |

\* cited by examiner

APPARATUS AND METHOD FOR DIAGNOSING CURRENT SENSOR

TECHNICAL FIELD

The present application claims priority to Korean Patent Application No. 10-2017-0177341 filed on Dec. 21, 2017 in the Republic of Korea, the disclosures of which are incorporated herein by reference.

The present disclosure relates to an apparatus and method for diagnosing a current sensor, and more particularly, to an apparatus and method for diagnosing a current sensor, which may improve diagnosing efficiency in diagnosing a current sensor on a charging/discharging path connected to a battery module.

BACKGROUND ART

In recent years, the demand for portable electronic products such as notebook computers, video cameras and portable phones has increased sharply, and the electric vehicles, energy storage batteries, robots and satellites has been active developed. Accordingly, high-performance secondary batteries allowing repeated charging and discharging are being actively studied.

Secondary batteries commercially available at the present include nickel-cadmium batteries, nickel-hydrogen batteries, nickel-zinc batteries, lithium secondary batteries and the like. Among them, the lithium secondary batteries have almost no memory effect compared to nickel-based secondary batteries and thus are in the limelight due to advantageous of free charging and discharging, low self-discharge rate and high energy density.

Battery packs are used in a wide variety of applications, and large capacities are often required for devices such as electric-driven vehicles or smart grid systems. In order to increase the capacity of the battery pack, the capacity of the secondary battery, namely the capacity of a battery cell itself, may be increased. However, in this case, the capacity increase effect is not large and there is a physical limitation on the size expansion of the secondary battery. Thus, generally, a battery pack in which a plurality of battery modules are connected in series and in parallel is widely used.

The battery pack often includes a battery management system (BMS) that manages battery modules. Further, the BMS monitors the temperature, voltage and current of the battery modules and controls the balancing operation, the cooling operation, the charging operation or the discharging operation of the battery pack based on the monitored state of the battery modules.

In order to monitor the current flowing through a charging/discharging path connected to the battery module, the BMS measures a voltage at both ends of a current sensor provided on the charging/discharging path and calculates the amount of current flowing through charging/discharging path by using the measured voltage at both ends. Here, if the current sensor is faulty and the current sensor comes to an open circuit state, the BMS calculates the amount of erroneous current and may determine that overcurrent flows in the charging/discharging path, based on the amount of erroneous current.

In order to diagnose whether the current sensor is in an open circuit state, a conventional technology for diagnosing whether the current sensor is in an open circuit state by using a current sensor diagnosis mode, which is a function of the BMS, has been proposed. However, during the current sensor diagnosis mode, the BMS is not able to measure the voltage, current and temperature of the secondary battery provided in the battery module.

In particular, the BMS should measure the voltage, current and temperature of the secondary battery and transmit the voltage, current and temperature to a micro controller unit (MCU) in the BMS or an electronic control unit (ECU) serving as a superior control device at a predetermined period, for example 1 ms intervals. However, if the current sensor diagnosis mode is performed, the voltage, current and temperature of the secondary battery is not able to be transmitted for a predetermined time, for example 100 ms.

DISCLOSURE

Technical Problem

The present disclosure is designed to solve the problems of the related art, and therefore the present disclosure is directed to providing an improved apparatus and method for diagnosing a current sensor, which may improve the diagnosing efficiency in the process of diagnosing a current sensor on a charging/discharging path connected to a battery module.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a current sensor that is serially connected to a battery module having at least one secondary battery, the apparatus comprising: a measuring unit respectively connected to both ends of each of the at least one secondary battery and both ends of the battery module to measure voltages at both ends of the at least one secondary battery and a voltage at both ends of the battery module, the measuring unit being respectively connected to both ends of the current sensor to measure a current flowing through the current sensor; and a control unit including a first deviation checking part for checking a first voltage deviation between the voltages at both ends of the secondary battery by setting a time difference to the voltages at both ends of the secondary battery, a second deviation checking part for adding the voltages at both ends of the at least one secondary battery to calculate an added voltage at both ends and checking a second voltage deviation between the added voltage at both ends and the voltage at both ends of the battery module, and a diagnosing part for diagnosing whether the current sensor is in an open circuit state by using the first voltage deviation checked by the first deviation checking part and the second voltage deviation checked by the second deviation checking part.

In addition, the control unit may further include a communication part for receiving the voltages at both ends of the at least one secondary battery and the voltage at both ends of the battery module from the measuring unit.

In addition, the control unit may further include a memory part for storing the voltages at both ends of the at least one secondary battery and the voltage at both ends of the battery module.

In addition, the first deviation checking part may compare a first voltage at both ends and a second voltage at both ends of the secondary battery, measured with a time difference, to check the first voltage deviation that is a deviation between the first voltage at both ends and the second voltage at both ends.

In addition, when receiving from the measuring unit that an overcurrent flows, the first deviation checking part may check whether the first voltage deviation occurs, and when the first deviation checking part determines that the first voltage deviation does not occur, the diagnosing part may diagnose that the current sensor is in an open circuit state.

In addition, when receiving from the measuring unit that an overcurrent flows, the second deviation checking part may compare the added voltage at both ends and the voltage at both ends of the battery module to check the second voltage deviation that is a deviation between the added voltage at both ends and the voltage at both ends of the battery module, and when the second deviation checking part determines that the second voltage deviation does not occur, the diagnosing part may diagnose that the current sensor is in an open circuit state.

In another aspect of the present disclosure, there is also provided a battery management system (BMS), comprising an apparatus for diagnosing a current sensor according to the present disclosure.

In another aspect of the present disclosure, there is also provided a battery pack, comprising an apparatus for diagnosing a current sensor according to the present disclosure.

In another aspect of the present disclosure, there is also provided a method for diagnosing a current sensor that is serially connected to a battery module having at least one secondary battery, the method comprising: measuring voltages at both ends of the at least one secondary battery, a voltage at both ends of the battery module and a current flowing through the current sensor; checking a first voltage deviation by setting a time difference to the voltages at both ends of the at least one secondary battery, measured in the measuring step; adding the voltages at both ends of the at least one secondary battery, measured in the measuring step, to calculate an added voltage at both ends and checking a second voltage deviation between the added voltage at both ends and the voltage at both ends of the battery module; and diagnosing whether the current sensor is in an open circuit state by using the first and second voltage deviations, checked in the first and second voltage deviation checking steps.

Advantageous Effects

According to the present disclosure, the voltage, current and temperature of the secondary battery may be continuously measured while the current sensor is being diagnosed. In addition, the measured voltage may be used to diagnose whether the current sensor is in an open circuit state. Thus, it is possible to improve the diagnosing efficiency during the current sensor diagnosing process.

The present disclosure may have various effects other than the above, and other effects of the present disclosure may be understood from the following description and more clearly figured out by the embodiments of the present disclosure.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

In the specification, a secondary battery may include one unit cell or a plurality of unit cells connected in parallel. The unit cell means one independent cell that has a cathode terminal and a cathode terminal and is physically separable. For example, one pouch-type lithium polymer cell may be considered as a unit cell.

Figure 1:
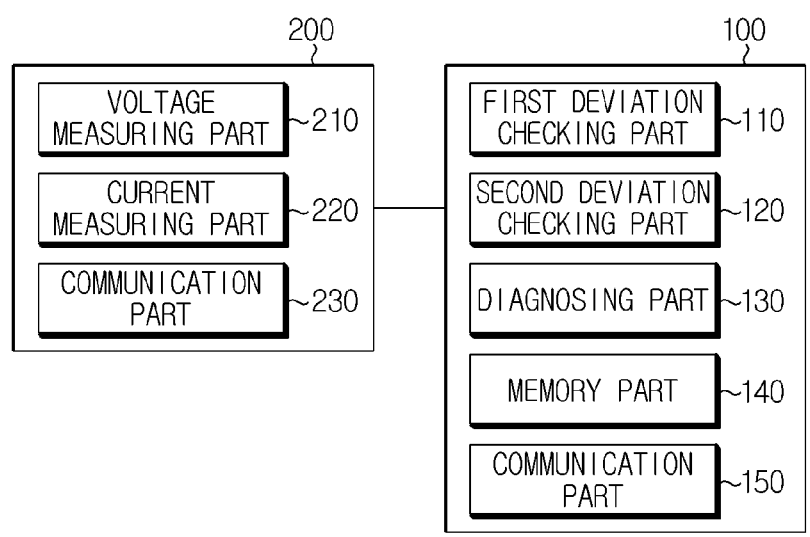
FIG. 1 is a diagram schematically showing a functional configuration of an apparatus for diagnosing a current sensor according to an embodiment of the present disclosure.
Figure 2:
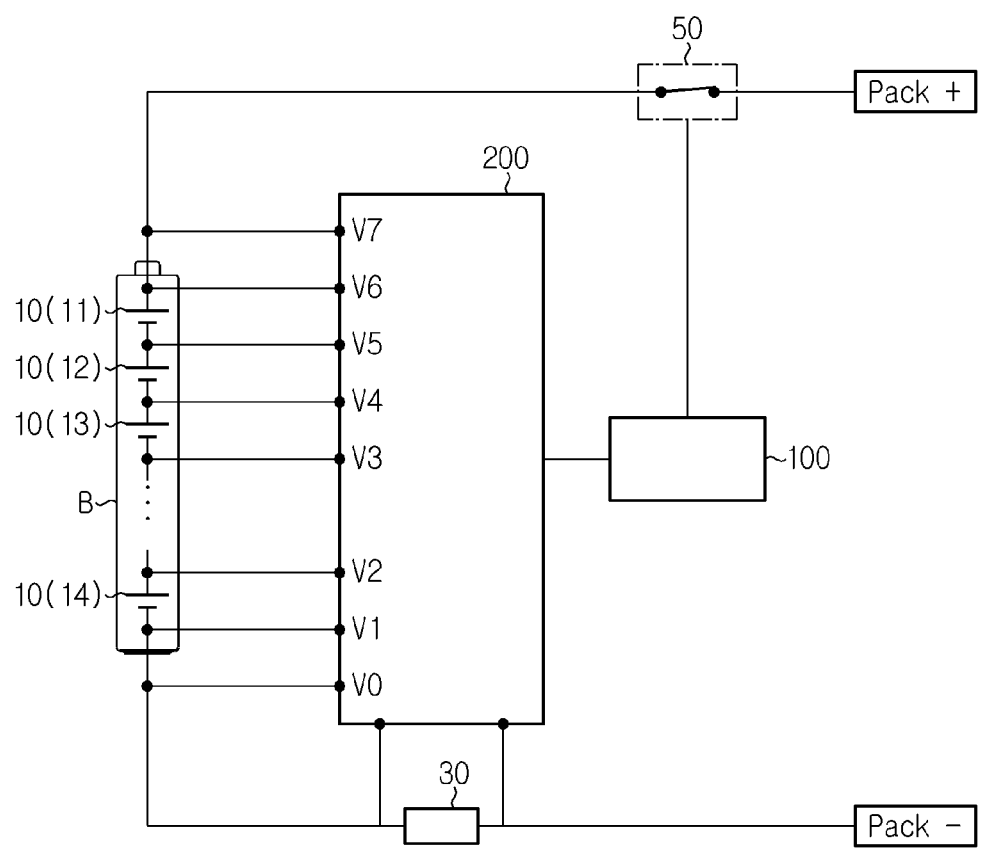
FIG. 2 is a diagram schematically showing that the apparatus for diagnosing a current sensor according to an embodiment of the present disclosure is connected to some components of a battery pack.

FIG. 1 is a diagram schematically showing a functional configuration of an apparatus for diagnosing a current sensor according to an embodiment of the present disclosure, and FIG. 2 is a diagram schematically showing that the apparatus for diagnosing a current sensor according to an embodiment of the present disclosure is connected to some components of a battery pack.

Referring to FIGS. 1 and 2, an apparatus for diagnosing a current sensor (hereinafter, also referred to "a current sensor diagnosing apparatus") according to the present disclosure includes a measuring unit 200 and a control unit 100.

The measuring unit 200 may include a voltage measuring part 210 and a current measuring part 220. The voltage measuring part 210 may be connected to both ends of each of at least one secondary battery 10 and both ends of a battery module B, respectively. For example, as shown in FIG. 2, if the battery module B includes a plurality of secondary batteries 11, 12, 13, 14 connected in series, the voltage measuring part 210 may be connected to both ends of each of the plurality of secondary batteries. In addition, the voltage measuring part 210 may be connected to both ends of the battery module B, namely a positive terminal of the battery module B and a negative terminal of the battery module B.

Moreover, the voltage measuring part 210 may measure voltages at both ends of at least one secondary battery 10 and a voltage at both ends of the battery module B. For example, as shown in FIG. 2, if the battery module B includes a plurality of secondary batteries 11, 12, 13, 14 connected to each other in series, the voltage measuring part 210 may measure the voltages at both ends of at least one secondary battery 10 by using the plurality of voltages V1, V2, V3, V4, V5, V6 applied to terminals respectively connected to both ends of the plurality of secondary batteries 10. Specifically, the voltage measuring part 210 may measure a voltage at both ends of each secondary batteries 10 using a potential difference between the voltages measured at both ends of secondary batteries 10. For example, the voltage measuring part 210 may measure a voltage at both ends of the first secondary battery 11 by using a potential difference between the sixth measured voltage V6 and the fifth measured voltage V5.

In addition, the voltage measuring part 210 may measure the voltage at both ends of the battery module B by using a plurality of voltages V0, V7 applied to terminals respectively connected to both ends of the battery module B. Specifically, the voltage measuring part 210 may measure the voltage at both ends of the battery module B by using a potential difference between the voltages measured at both ends of the battery module B. For example, the voltage measuring part 210 may measure the voltage at both ends of the battery module B by using a potential difference between the seventh measured voltage V7 and the reference measured voltage V0. In this configuration, the measuring unit 200 according to the present disclosure may be respectively connected to both ends of each of the at least one secondary battery 10 and both ends of the battery module B and measure the voltage at both ends of the at least one secondary battery 10 and the voltage at both ends of the battery module B.

The current measuring part 220 may be respectively connected to both ends of the current sensor 30, which are connected to the battery module B in series. For example, as shown in FIG. 2, the current measuring part 220 may be electrically connected directly to a contact point where a negative electrode terminal of the battery module B and one end of the current sensor 30 are commonly connected. Also, the current measuring part 220 may be electrically connected to the other end of the current sensor 30 directly.

In addition, the current measuring part 220 may measure the current flowing through the current sensor 30. In particular, the current measuring part 220 may measure voltage at both ends of the current sensor 30 and measure the current flowing through the current sensor 30 by using the measured voltage at both ends of the current sensor 30. For example, the current measuring part 220 may measure the current flowing through the current sensor 30 by substituting the pre-stored resistance of the current sensor 30 and the voltage at both ends of the current sensor 30 into the Ohm's law. In this configuration, the measuring unit 200 according to the present disclosure may be respectively connected to both ends of the current sensor 30 and measure the current flowing through the current sensor 30.

Preferably, as shown in FIG. 1, the measuring unit 200 according to the present disclosure may further include a communication part 230. The communication part 230 may communicate with other components of the current sensor diagnosing apparatus according to the present disclosure. In particular, the communication part 230 may transmit information measured by the voltage measuring part 210 and the current measuring part 220 to other components of the current sensor diagnosing apparatus.

More preferably, the measuring unit 200 according to the present disclosure may measure voltage and current through the voltage measuring part 210 and the current measuring part 220 at predetermined time intervals and transmit the measured voltage and current to other components of the current sensor diagnosing apparatus through communication part 230 at predetermined time intervals.

As shown in FIG. 1, the control unit 100 includes a first deviation checking part 110, a second deviation checking part 120 and a diagnosing part 130.

The first deviation checking part 110 may check a first voltage deviation between the voltages at both ends of the secondary battery 10 by setting a time difference between the voltages at both ends of at least one secondary battery 10. In particular, the first deviation checking part 110 compares a first voltage at both ends and a second voltage at both ends of the secondary battery 10, which are measured with a time difference, to check the first voltage deviation that is a deviation between the first voltage at both ends and the second voltage at both ends.

Specifically, the first deviation checking part 110 may check the first voltage deviation, which is an absolute value of the difference between the first voltage at both ends and the second voltage at both ends by using the first voltage at both ends and the second voltage at both ends, measured according to a predetermined measurement time difference or a measurement time difference according to an external input signal input from the user. Here, the first voltage at both ends and the second voltage at both ends may mean the voltages at both ends of the secondary battery 10, measured at different times for one secondary battery 10.

For example, if a voltage at both ends of the first secondary battery 11 is measured for the first time and then the voltage at both ends is measured repeatedly after 1 ms, the firstly measured voltage at both ends may be the first voltage at both ends, and the voltage at both ends measured after 1 ms may be the second voltage at both ends. Here, when checking the first voltage deviation between the voltages at both ends of the first secondary battery 11, the first deviation checking part 110 may check the first voltage deviation by using the first voltage at both ends and the second voltage at both ends, measured by the measuring unit 200 with a time difference of 1 ms.

In an embodiment of the present disclosure, if the firstly measured voltage at both ends of the first secondary battery 11 is 4.0 V and the voltage at both ends of the first secondary battery 11 measured at 1 ms is 3.8 V, since the first voltage at both ends is 4.0V and the second voltage at both ends is 3.8V, the first voltage deviation may be 0.2V.

The second deviation checking part 120 may calculate an added voltage at both ends by adding the voltages at both ends of at least one secondary battery 10. In particular, the second deviation checking part 120 may calculate the added voltage at both ends by adding the voltages at both ends of the plurality of secondary batteries 10 measured at the same time. Here, the second deviation checking part 120 may calculate the added voltage at both ends by adding the voltages at both ends of all the secondary batteries 10 provided in the battery module B.

For example, as shown in FIG. 2, if the battery module B includes a plurality of secondary batteries 11, 12, 13, 14 connected in series, the second deviation checking part 120 may calculate the added voltage at both ends by adding the voltages at both ends of the plurality of secondary batteries 11, 12, 13, 14.

In addition, the second deviation checking part 120 may check a second voltage deviation between the added voltage at both ends of the at least one secondary battery 10 and the voltage at both ends of the battery module B. In particular, the second deviation checking part 120 may check the second voltage deviation, which is a deviation between the added voltages, obtained by adding the voltages at both ends of the plurality of secondary batteries 10 measured at the same time, and the voltage at both ends of the battery module B.

For example, as shown in FIG. 2, if the battery module B includes a plurality of secondary batteries 11, 12, 13, 14 connected in series, the second deviation checking part 120 may check the second voltage deviation, which is a deviation between the added voltages, obtained by adding the voltages at both ends of the plurality of secondary batteries 11, 12, 13, 14 measured at the same time, and the voltage at both ends of the battery module B.

In an embodiment of the present disclosure, if the voltage at both ends of the first secondary battery 11 is 3.33, the voltage at both ends of the second secondary battery 12 is 3.31 V, the voltage at both ends of the third secondary battery 13 is 3.29 V and the voltage at both ends of the fourth secondary battery 14 is 3.32 V, the added voltage at both ends, obtained by adding the voltages at both ends of the plurality of secondary batteries 11, 12, 13, 14, may be 13.25V. Here, if the voltage at both ends of the battery module B is 13.5 V, the second voltage deviation may be 0.25 V.

The diagnosing part 130 may diagnose whether the current sensor 30 is in an open circuit state by using first voltage deviation and the second voltage deviation. In particular, the diagnosing part 130 may diagnose whether the current sensor 30 is in an open circuit state by using the first voltage deviation checked by the first deviation checking part 110 and the second voltage deviation checked by the second deviation checking part 120.

For example, the diagnosing part 130 may determine that current is flowing through the secondary battery 10 if the first voltage deviation occurs. Also, the diagnosing part 130 may determine that current does not flow through the secondary battery 10 if the first voltage deviation does not occur. In particular, the diagnosing part 130 may set that the first voltage deviation occurs when an absolute value of the first voltage deviation is equal to or greater than a preset value, and set that the first voltage deviation does not occur when the absolute value of the first voltage deviation is lower than the preset value.

In addition, the diagnosing part 130 may determine that current is flowing through the battery module B if the second voltage deviation occurs. Also, the diagnosing part 130 may determine that the current does not flow through the battery module B if the second voltage deviation does not occur. In particular, the diagnosing part 130 may set that the second voltage deviation occurs when an absolute value of the second voltage deviation is equal to or greater than a preset value and set that the second voltage deviation does not occur when the absolute value of the second voltage deviation is lower than the preset value.

Preferably, the control unit 100 according to the present disclosure may further include a communication part 150 as shown in FIG. 1.

The communication part 150 may communicate with the measuring unit 200. In particular, the communication part 150 may receive the voltages at both ends of at least one secondary battery 10 and the voltage at both ends of the battery module B from the measuring unit 200.

Also preferably, the control unit 100 according to the present disclosure further include a memory part 140 as shown in FIG. 1.

The memory part 140 may store the voltages at both ends of at least one secondary battery 10 and the voltage at both ends of the battery module B. The memory part 140 is not particularly limited as long as it is a storage medium capable of recording and erasing information. For example, the memory part 140 may be a RAM, a ROM, a register, a hard disk, an optical recording medium, or a magnetic recording medium. In addition, the memory part 140 may be electrically connected to components of the control unit 100 through a data bus or the like so as to be accessible by the components of the control unit 100. Also, the memory part 140 may store and/or update and/or erase and/or transmit data that is generated when a program including various control logics performed in the control unit 100 and/or the control logics are executed. The memory part 140 may be logically divided into two or more parts.

Preferably, the first deviation checking part 110 and the second deviation checking part 120 according to an embodiment of the present disclosure may receive information that an overcurrent flows, namely an overcurrent alarm signal, from the measuring unit 200. Here, if the current measured using the voltage at both ends of the current sensor 30 is equal to or greater than a preset value, the measuring unit 200 may generate an overcurrent alarm signal and transmit the overcurrent alarm signal to the control unit 100.

The overcurrent alarm signal may be generated through the measuring unit 200 when an overcurrent flows in an actual charging/discharging path and when the current sensor 30 is in an open circuit state. Thus, when the overcurrent alarm signal is generated, the current sensor diagnosing apparatus according to the present disclosure may determine whether the overcurrent alarm signal is generated due to an actual overcurrent or whether the overcurrent alarm signal is generated due to the open circuit of the current sensor 30.

More preferably, the first deviation checking part 110 according to the present disclosure may check whether the first voltage deviation occurs when receiving information that an overcurrent flows from the measuring unit 200. In addition, the diagnosing part 130 may diagnose that the current sensor 30 is in an open circuit state if the first deviation checking part 110 checks that the first voltage deviation does not occur.

More preferably, when receiving information that an overcurrent flows from the measuring unit 200, the second deviation checking part 120 according to the present disclosure may check the second voltage deviation, which is a deviation between the added voltage at both ends and the voltage at both ends of the battery module B, by comparing the added voltage at both ends and the voltage at both ends of the battery module B. In addition, the diagnosing part 130 may diagnose that the current sensor 30 is in an open circuit state if the second deviation checking part 120 checks that the second voltage deviation does not occur.

Preferably, the control unit 100 may control turn-on and turn-off operations of the switching part 50 provided on the charging/discharging path. In particular, if the control unit 100 receives information that an overcurrent flows from the measuring unit 200 but the diagnosing part 130 diagnoses that the current sensor 30 is in an open circuit state, the control unit 100 may not transmit a turn-off command to the switching part 50. The switching part 50 may be a relay or a field effect transistor (FET).

Meanwhile, the control unit 100 may be implemented to include a processor, an application-specific integrated circuit (ASIC), another chipset, a logic circuit, a register, a communication modem, and/or a data processing device, selectively.

The current sensor diagnosing apparatus according to the present disclosure may be applied to a battery management system (BMS). That is, the BMS according to the present disclosure may include the current sensor diagnosing apparatus of the present disclosure as described above. In this configuration, at least a part of the components of the current sensor diagnostic apparatus according to the present disclosure may be implemented by supplementing or adding functionality of components included in the conventional BMS. For example, the measuring unit 200 and the control unit 100 of the current sensor diagnosing apparatus according to the present disclosure may be implemented as components of the BMS.

In addition, the current sensor diagnosis apparatus according to the present disclosure may be provided to a battery pack. That is, the battery pack according to the present disclosure may include the current sensor diagnosing apparatus of the present disclosure as described above. Here, the battery pack may include at least one secondary battery, the current sensor diagnosing apparatus, electrical components (including a BMS, a relay, a fuse, and the like), and a case.

Figure 3:
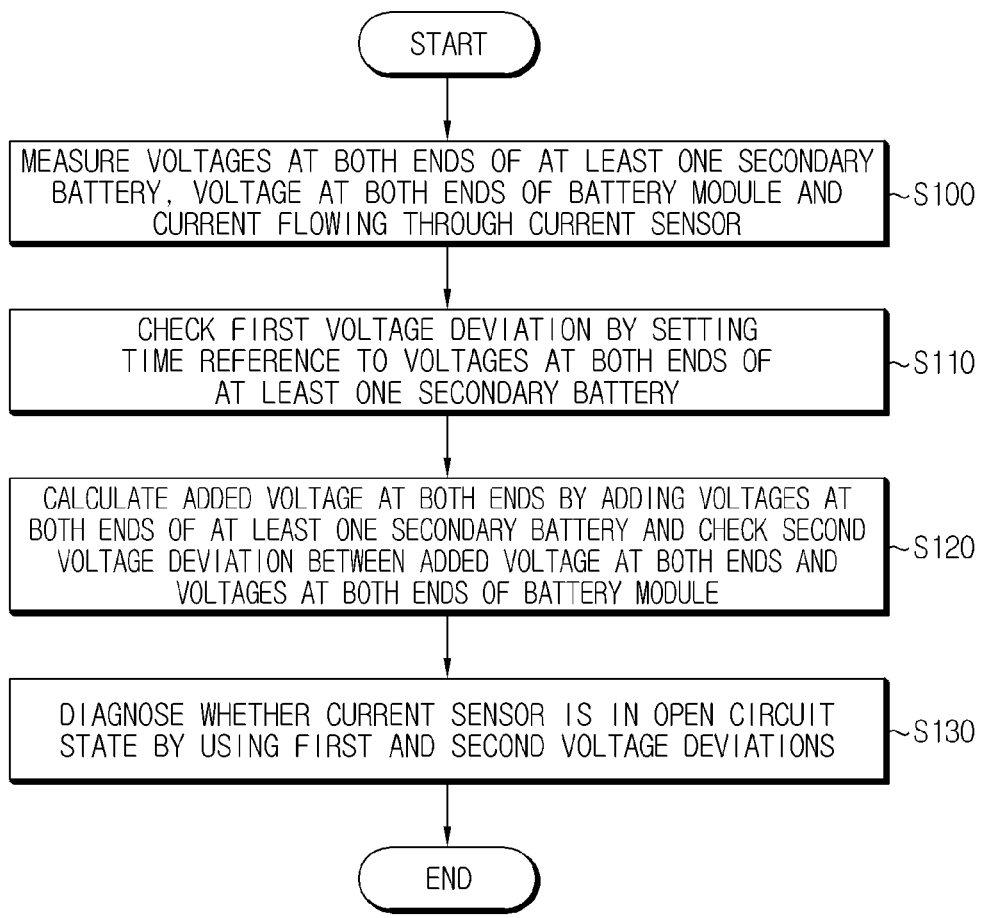
FIG. 3 is a schematic flowchart for illustrating a method for diagnosing a current sensor according to an embodiment of the present disclosure.

FIG. 3 is a schematic flowchart for illustrating a method for diagnosing a current sensor according to an embodiment of the present disclosure. In FIG. 3, each step may be performed by any component of the current sensor diagnosing apparatus according to the present disclosure as described above.

As shown in FIG. 3, in Step S100, the measuring unit measures voltages at both ends of at least one secondary battery, a voltage at both ends of the battery module, and a current flowing through the current sensor.

In Step S110, the control unit checks the first voltage deviation by setting a time difference to the voltages at both ends of at least one secondary battery. Here, the time difference may be set according to a predetermined time period, an input signal of a user, or an overcurrent alarm signal. Also, it may be checked that the first voltage deviation occurs if an absolute value of the calculated deviation is equal to or greater than a preset value. For example, the preset value may be 0 (zero).

In Step S120, the control unit calculates an added voltage at both ends by adding the voltages at both ends of the at least one secondary battery and checks a second voltage deviation between the added voltage at both ends and the voltage at both ends of the battery module. Here, the added voltage at both ends and the voltage at both ends of the battery module may be the sum of the voltages at both ends of the at least one secondary battery measured at the same time and the voltage at both ends of the battery module.

Preferably, Step S110 and Step S120 may be performed simultaneously. Also, Step S120 may be performed before Step S110.

In Step S130, the control unit diagnoses whether the current sensor is in an open circuit state by using the first and second voltage deviations. In an embodiment of the present disclosure, the control unit may diagnose that the current sensor is in an open circuit state if the first voltage deviation does not occur. Also, in another embodiment of the present disclosure, the control unit may diagnose that the current sensor is in an open circuit state if the second voltage deviation does not occur. In addition, in still another embodiment of the present disclosure, the control unit may diagnose that the current sensor is in an open circuit state if both the first voltage deviation and the second voltage deviation do not occur.

According to the present disclosure, the measuring unit may continuously measure the voltages and charging/discharging currents of the battery module and the secondary battery, and continuously transmit the measured information to a superior control device to diagnose whether the current sensor is in an open circuit by using the measured voltage. Thus, it is possible to increase the diagnosing efficiency of the current sensor by using the measured information without using the current sensor diagnosis function of the measuring unit provided separately.

Figure 4:
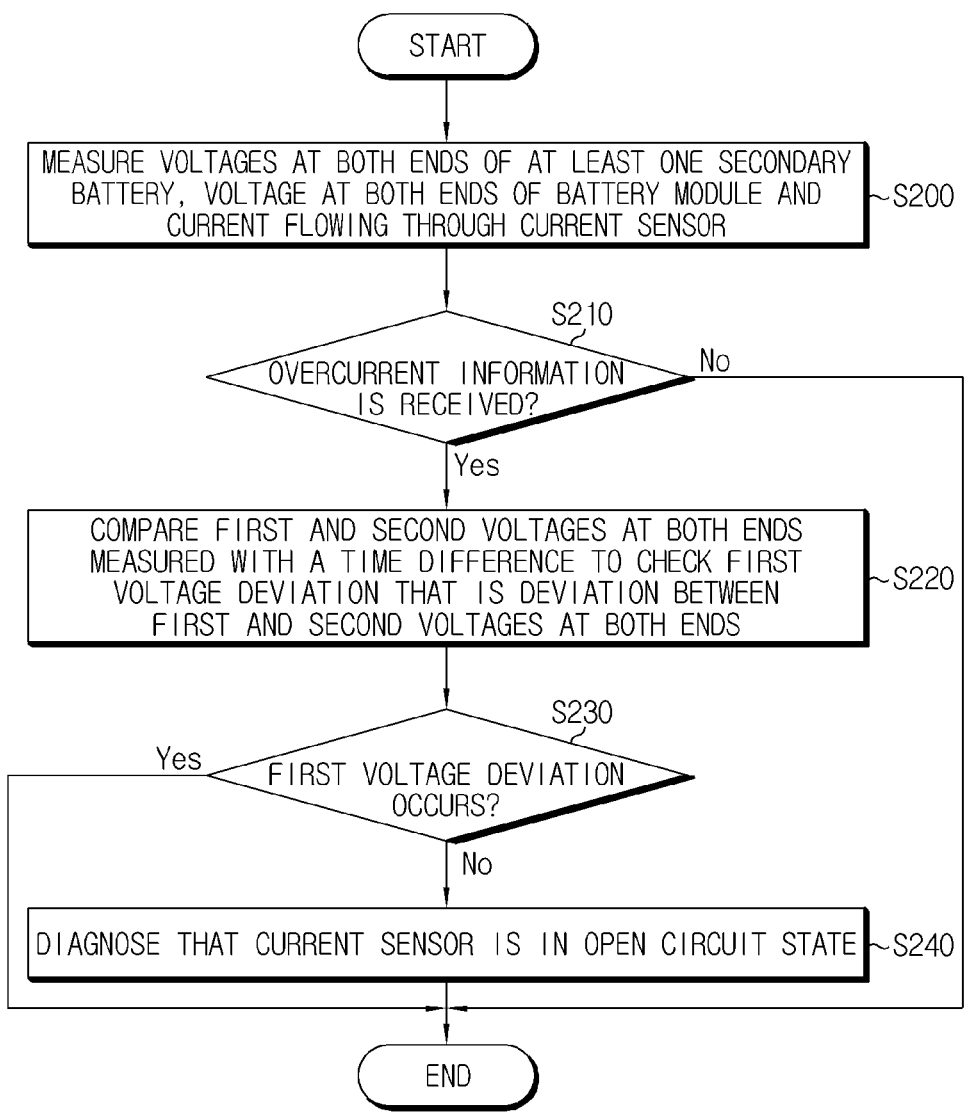
FIG. 4 is a schematic flowchart for illustrating a method for diagnosing a current sensor according to another embodiment of the present disclosure.

FIG. 4 is a schematic flowchart for illustrating a method for diagnosing a current sensor according to another embodiment of the present disclosure. In FIG. 4, each step may be performed by any component of the current sensor diagnosing apparatus according to the present disclosure as described above.

As shown in FIG. 4, in Step S200, the measuring unit measures voltages at both ends of at least one secondary battery, a voltage at both ends of the battery module, and a current flowing through the current sensor. Here, the measuring unit may determine that an overcurrent flows in the charging/discharging path if the measured current is equal to or greater than a preset value. In addition, the measuring unit may transmit information that overcurrent flows to the control unit. For example, the measuring unit may generate an overcurrent alarm signal and transmit the overcurrent alarm signal to the control unit.

In Step S210, the control unit determines whether the information indicating that an overcurrent flows is received from the measuring unit. If the determination result of Step S210 is YES, the process proceeds to Step S220. Thus, through the process after Step S220, the control unit determines whether an overcurrent actually flows in the charging/discharging path or whether the current sensor is in an open circuit state. Meanwhile, if the determination result of Step S210 is NO, the process ends.

In Step S220, the control unit compares first and second voltages at both ends of the secondary battery measured with a time difference to check the first voltage deviation, which is a deviation between the first and second voltages at both ends. Here, the time difference may be set according to a predetermined time period, an input signal of a user, or an overcurrent alarm signal. Also, it may be checked that the first voltage deviation occurs if an absolute value of the calculated deviation between the first and second voltages at both ends is equal to or greater than a preset value. For example, the preset value may be 0 (zero).

In Step S230, the control unit determines whether the first voltage deviation occurs. If the determination result of Step S230 is NO, the process proceeds to Step S240. Meanwhile, if the determination result of Step S230 is YES, the process ends.

In Step S240, the control unit diagnoses that the current sensor is in an open circuit state. Preferably, if it is diagnosed that the current sensor is in an open circuit state, the control unit may generate an open circuit alarm signal and transmit the open circuit alarm signal to a superior control device. For example, if the current sensor diagnosing apparatus according to the present disclosure is mounted to an electric vehicle, the superior control device may be an electronic control unit (ECU).

According to the present disclosure, it is possible to quickly check whether the current sensor is in an open circuit state, without unnecessarily turning off the relay by erroneously diagnosing the open circuit state of the current sensor as an overcurrent state.

Figure 5:
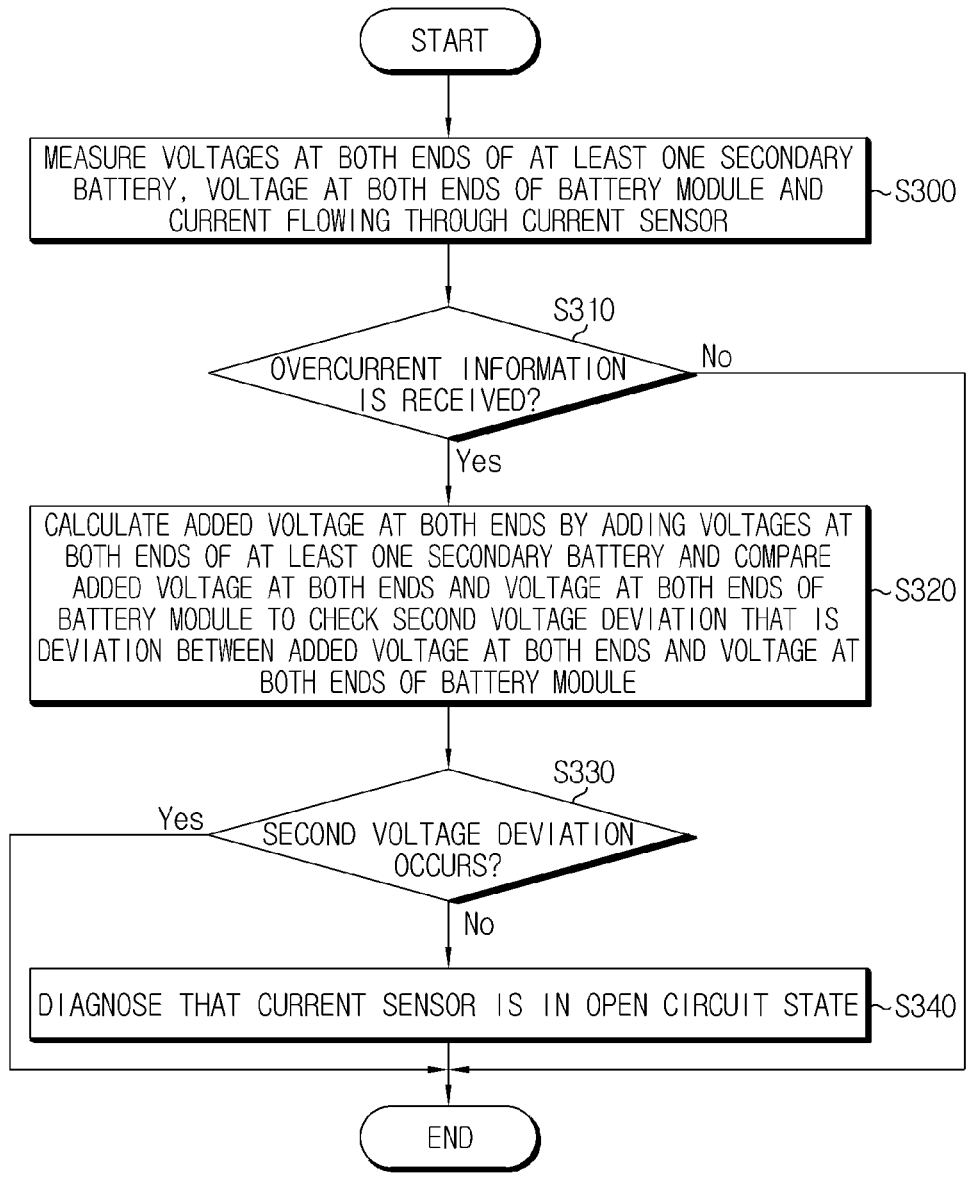
FIG. 5 is a schematic flowchart for illustrating a method for diagnosing a current sensor according to still another embodiment of the present disclosure.

FIG. 5 is a schematic flowchart for illustrating a method for diagnosing a current sensor according to still another embodiment of the present disclosure. In FIG. 5, each step may be performed by any component of the current sensor diagnosing apparatus according to the present disclosure as described above.

As shown in FIG. 5, in Step S300, the measuring unit measures voltages at both ends of at least one secondary battery, a voltage at both ends of the battery module, and a current flowing through the current sensor. Here, the measuring unit may determine that an overcurrent flows in the charging/discharging path if the measured current value is equal to or greater than a preset value. In addition, the measuring unit may transmit information that an overcurrent flows to the control unit. For example, the measuring unit may generate an overcurrent alarm signal and transmit the overcurrent alarm signal to the control unit.

In Step S310, the control unit determines whether information indicating that an overcurrent flows is received from the measuring unit. If the determination result of Step S310 is YES, the process proceeds to Step S320. Thus, through the process after Step S320, the control unit determines whether an overcurrent actually flows in the charging/discharging path or whether the current sensor is in an open circuit state. Meanwhile, if the determination result of Step S310 is NO, the process ends.

In Step S320, the control unit calculates an added voltage at both ends by adding the voltages at both ends of the at least one secondary battery and compares the added voltage at both ends with the voltage at both ends of the battery module to check the second voltage deviation, which is a deviation between the added voltage at both ends and the voltage at both ends of the battery module. Here, the added voltage at both ends and the voltage at both ends of the battery module may be the sum of the voltages at both ends of the at least one secondary battery measured at the same time and the voltage at both ends of the battery module.

In Step S330, the control unit determines whether a second voltage deviation occurs. If the determination result of Step S330 is NO, the process proceeds to Step S340. Meanwhile, if the determination result of Step S330 is YES, the process ends.

In Step S340, the control unit diagnoses that the current sensor is in an open circuit state. Preferably, if it is diagnosed that the current sensor is in an open circuit state, the control unit may generate an open circuit alarm signal and transmit the open circuit alarm signal to a superior control device. For example, if the current sensor diagnosing apparatus according to the present disclosure is mounted to an electric vehicle, the superior control device may be an electronic control unit (ECU).

According to the present disclosure, it is possible to quickly check whether the current sensor is in an open circuit state, without unnecessarily turning off the relay by erroneously diagnosing the open circuit state of the current sensor as an overcurrent state.

Also, when the control logic is implemented in software, the control unit may be implemented as a set of program modules. At this time, the program modules may be stored in a memory device and executed by a processor.

In addition, there is no particular limitation on the types of various control logics of the control unit, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Meanwhile, in this specification, the terms 'unit' and 'part' are used, such as 'measuring unit', 'control unit' and 'diagnosing part'. However, it will be apparent to those skilled in the art that these terms just represent logical configuration units and are not intended to represent components that are physically separable or must be physically separated.

What is claimed is:
1. An apparatus for diagnosing a current sensor that is serially connected to a battery module having at least one secondary battery, the apparatus comprising:
  a measuring unit respectively connected to each of:
    both ends of at least one secondary battery; and
    both ends of the battery module
  to measure:
    voltages at both ends of each secondary battery; and
    a voltage at both ends of the battery module,
  the measuring unit being respectively connected to both ends of the current sensor to measure a current flowing through the current sensor; and
  a control unit including:
    a first deviation checking part for checking a first voltage deviation between (i) the voltages at both ends of each secondary battery at a first time and (ii) the voltages at both ends of each secondary battery at a second time, by setting a time difference;
    a second deviation checking part for summing the voltages at both ends of each secondary battery to calculate a summed voltage at both ends and checking a second voltage deviation between (i) the summed voltage and (ii) the voltage at both ends of the battery module; and a diagnosing part for diagnosing whether the current sensor is in an open circuit state by using the first voltage deviation checked by the first deviation checking part and the second voltage deviation checked by the second deviation checking part.

2. The apparatus for diagnosing a current sensor according to claim 1,
wherein the control unit further includes a communication part for receiving the voltages at both ends of each secondary battery and the voltage at both ends of the battery module from the measuring unit.

3. The apparatus for diagnosing a current sensor according to claim 1,
wherein the control unit further includes a memory part for storing the voltages at both ends of each secondary battery and the voltage at both ends of the battery module.

4. The apparatus for diagnosing a current sensor according to claim 1,
wherein, for a given secondary battery, the first deviation checking part compares a first voltage at both ends of the secondary battery at the first time and a second voltage at both ends of the secondary battery at the second time, to check the first voltage deviation that is a deviation between the first voltage and the second voltage.

5. The apparatus for diagnosing a current sensor according to claim 4,
wherein when receiving from the measuring unit that an overcurrent flows, the first deviation checking part checks whether the first voltage deviation occurs, and
wherein when the first deviation checking part determines that the first voltage deviation does not occur, the diagnosing part diagnoses that the current sensor is in the open circuit state.

6. The apparatus for diagnosing a current sensor according to claim 1,
wherein when receiving from the measuring unit that an overcurrent flows, the second deviation checking part compares the summed voltage and the voltage at both ends of the battery module to check the second voltage deviation that is a deviation between the summed voltage and the voltage at both ends of the battery module, and
wherein when the second deviation checking part determines that the second voltage deviation does not occur, the diagnosing part diagnoses that the current sensor is in the open circuit state.

7. The apparatus for diagnosing a current sensor according to claim 1, wherein the apparatus is included in a battery management system (BMS) configured to perform at least one of: monitoring a temperature of the battery module, control a balancing operation of the battery module, control a cooling operation of the battery module, control a charging operation of the battery module, or control a discharging operation of the battery module.

8. A battery pack, comprising:
a battery module having at least one secondary battery;
a switching part provided on a charging/discharging path of the battery module;
a current sensor serially connected to the battery module; and
the apparatus according to claim 1.

9. A method for diagnosing a current sensor that is serially connected to a battery module having at least one secondary battery, the method comprising:
measuring voltages at both ends of each secondary battery, a voltage at both ends of the battery module and a current flowing through the current sensor;
checking a first voltage deviation by measuring voltages at both ends of each secondary battery a second time by setting a time difference;
summing the voltages at both ends of each secondary battery, measured in the measuring step, to calculate a summed voltage at both ends;
checking a second voltage deviation between (i) the summed voltage and (ii) the voltage at both ends of the battery module; and
diagnosing whether the current sensor is in an open circuit state by using the first and second voltage deviations, checked in the first and second voltage deviation checking steps.

* * * * *